US006336086B1

(12) United States Patent
Perez et al.

(10) Patent No.: US 6,336,086 B1
(45) Date of Patent: Jan. 1, 2002

(54) METHOD AND SYSTEM FOR ANALYZING WAFER PROCESSING ORDER

(75) Inventors: Almudena Fernandez Perez; Victorino Martin Santa Maria; Miguel Angel Merino Alonso; Julian Moreno Garrido; Miguel Recio Segoviano, all of Madrid (ES)

(73) Assignee: Agere Systems Guardian Corp., Orlando, FL (US)

( * ) Notice: Subject to any disclaimer, the term of this patent is extended or adjusted under 35 U.S.C. 154(b) by 0 days.

(21) Appl. No.: 09/211,481

(22) Filed: Dec. 14, 1998

Related U.S. Application Data

(60) Provisional application No. 60/096,407, filed on Aug. 13, 1998.

(51) Int. Cl.[7] .............................................. G06F 17/50
(52) U.S. Cl. ................................ 703/13; 703/2; 703/5; 382/141; 382/145; 382/149; 706/52
(58) Field of Search ................... 703/2, 5, 13; 382/149, 382/141, 144, 145; 700/51, 50; 706/8, 52

(56) References Cited

U.S. PATENT DOCUMENTS

| | | | | |
|---|---|---|---|---|
| 5,544,256 A | * | 8/1996 | Brecher et al. | 382/149 |
| 5,710,700 A | * | 1/1998 | Kurtzberg et al. | 364/149 |
| 5,943,662 A | * | 8/1999 | Baba et al. | 706/23 |
| 6,122,397 A | * | 9/2000 | Lee et al. | 382/149 |
| 6,148,099 A | * | 11/2000 | Lee et al. | 382/149 |
| 6,156,580 A | * | 12/2000 | Wooten et al. | 438/16 |
| 6,178,257 B1 | * | 1/2001 | Alumot et al. | 382/145 |

OTHER PUBLICATIONS

Gondran, Chris, "A Technique for Measuring and Improving Yield Team Performance" Motorola MOS–13, Austin, Texas.

Lee et al., "Yield Enhancement Strategies for Start–Up of a High–Volume 8–inch Wafer Fab" 1995 IEEE/SEMI Advanced Semiconductor Manufacturing Conference, 272–275.

Cunningham et al., "Semiconductor Yield Improvement: Results & Best Practice", Engineering Systems Research Center, University of California, Berkeley, ESRC94–14/ CSM–10, Sep. 1994, 1–17.

(List continued on next page.)

*Primary Examiner*—Kevin J. Teska
*Assistant Examiner*—Thai Phan
(74) *Attorney, Agent, or Firm*—Morris &; Steven E. Koffs

(57) ABSTRACT

A computer analyzes a process for fabricating a plurality of semiconductor wafers. The process has a plurality of processing steps, performed on various fabrication machines. The program is knowledge based, and is trained using training data, which may be generated by a simulator. A decision tree is generated, based on the training data. A plurality of input data representing characteristics of the semiconductor wafers are extracted. A first order pattern in any of the processing steps is identified using a decision tree, based on the input data. A plurality of probability distribution functions are formed for each characteristic. Each distribution function identifies a probability that a particular type of order pattern is present. A threshold is based on the plurality of probability distribution functions. A second order pattern in any of the processing steps is identified by comparing the data representing characteristics to the threshold. A third order pattern in any one of the processing steps is identified based on a calculated distance from a centroid computed from the data representing characteristics. One of the first, second, and third order patterns is selected, and one of the processing steps is identified as being associated with the selected order pattern. A problem in one of the plurality of machines is identified, based on a type of problem associated with the selected order pattern.

22 Claims, 6 Drawing Sheets

OTHER PUBLICATIONS

Recio et al., "Advanced software system for yield improvement on manufacturing fab", 219–229, SPIE vol. 2874, 0–8194–2272–X/96.

Martin et al., "Knowledge–Based Software System for Fast Yield Loss Detection in a Semiconductor Fab", 88–101, SPIE vol. 3216, 0277–786X/97.

Lee et al., "Factory Start–Up and Production Ramp: Yield Improvement through Signature Analysis and Visual/Electrical Correlation", 1995 IEEE/SEMI Advanced Semiconductor Manufactturing Conference, 267–270.

Fernandez et al., Bitmap in Multimodule IC as a Tool for Baseline Failure Analysis, ISTFA 96 proceedings.

Murthy et al., "A System for Induction of Oblique Decision Trees", J. Art. Intel Res. 2 (1994) 1–32.

Merino et al., "Yield Improvement Via Automatic Analysis of Wafer Processing Order" SPIE vol. 3510, 0277–786X/98, 135–146.

* cited by examiner

FIG. 1

| ORDER PATTERN | POSITRAK LOT STEP PLOT | PROCESS TYPE | ISSUE |
|---|---|---|---|
| 1/3 | | 3-CHAMBERS MACHINE | |
| 1/2 | | 2-CHAMBERS MACHINE | |
| BATCH | | BATCH | |
| DEGRADATION (DESCENDING) | | SINGLE WAFER MACHINE | BAD CONDITIONS BETWEEN WAFERS |
| | | SINGLE & MULTIPLE LOT MACHINE | PROCESS PROFILE ISSUE PARTICLE ISSUE |
| REGENERATION (ASCENDING) | | SINGLE WAFER MACHINE | BAD INITIAL CONDITIONING |
| | | SINGLE & MULTIPLE LOT MACHINE | PROCESS PROFILE ISSUE PARTICLE ISSUE |

POSITION (NUMBER OF WAFER: 24)

POSITION (NUMBER OF WAFER: 25)

METHOD AND SYSTEM FOR ANALYZING WAFER PROCESSING ORDER

This application claims the benefit of U.S. Provisional Application No. 60/096,407, filed Aug. 13, 1998.

FIELD OF THE INVENTION

The present invention relates to methods and systems for analyzing and troubleshooting a fabrication process.

DESCRIPTION OF THE RELATED ART

In semiconductor fabrication, wafers from the same lot do not always have the same yield. Although the yield lost in every wafer may originate during any step of the fabrication routing, very often most of the lost yield can be attributed to just one step, and affects some or all the wafers within the lot. In this particular "killing" step, wafers may have been processed sequentially one-by-one, in a multi-chamber tool, or the whole lot simultaneously. However, when one of the chambers of a multichamber tool impacts the yield, only the wafers which pass through that chamber are affected. If the processing order (by bar-code reading the wafers) for that tool is recorded, there is a relation between wafer number and yield. In the same way yield loss may be related to other type of process tools.

The inventors previously developed an advanced software system, (POSITRAK) to correlate processing order and yield. This system is described in M. Recio, A. Fernández, V. Martin, M. J. Pemán, G. González, J. R. Hoyer, S. Whitlock, D. James and M. Hansen. "Advanced Software System for Yield Improvement in Manufacturing Fab". Proceedings on SPIE's 1996 Microelectronic Manufacturing, vol.2874, pp.219–229, 1996, which is incorporated by reference herein in its entirety.

Yield losses produced in different process tools may exhibit a type of footprint that is referred to herein as an "order pattern". POSITRAK correlates a yield metric (at the wafer level) with the process order of the wafers within the lot during a set of fabrication steps The main output it provides is the lot-step order plot, such as those in the second column of FIG. 1.

FIG. 1 is a table showing five different order patterns observed in fabrication processes in various types of machines. The first column of FIG. 1 is a name given to each of these order patterns. The second column contains an X-Y plot for each type of order pattern, in which the horizontal axis (independent variable) is the positioning or order of the wafers withing a lot at the particular step in the fabrication line in which the order pattern is observed; the vertical axis (dependent variable) is a quantitative measure of the yield. Thus, the dots at the top of each plot indicate high yield wafers, and the dots at the bottom of each plot indicate low yield wafers. The third column indicates the type of process in which the order pattern is observed. The fourth column indicates the problem which gives rise to the low yield observed in the wafers represented by the dots at the bottom of each plot.

For example, in the first row, an order pattern referred to as a "⅓" pattern, every third wafer which passes through a particular machine is observed to have a low yield metric. This type of order pattern is most likely to occur in a three chamber machine. When one of the chambers of a three-chamber tool is impacting yield, only the wafers passing through that chamber are affected.

In the second row, a "½" pattern is described. This type of order pattern is most likely to occur in a to chamber machine. When one of the chambers of a two chamber tool is impacting yield, only the wafers passing through that chamber are affected.

In the third row, there is no gradual trend. Wafers with low yield are grouped together in one or more batches. This occurs in batch type processes.

In the fourth row, degrading yields are observed. This indicates bad conditions between wafers. Similarly, in the fifth row, where low yields are only observed in the first few wafers, a poor initial condition is indicated.

There several common lot-step plots that are referred to as "order patterns" that have been repeatedly observed.

As mentioned above, wafer order is read at each module of the routing and wafers are randomized, or rearranged in a random order. That is, the order in which the wafers are processed in one step (or set of steps) differs from the order in which the wafers are processed in any other step (or set of steps). At each step, the wafer order is identified (for example, with a bar code scanner). In this way, when an order pattern shows up at a certain module (set of process steps), it does not show up at any other module of the fabrication routing, due to the randomization executed. Therefore, if there is any type of order pattern at any of the modules, POSITRAK can pinpoint it as origin of the yield loss. Moreover, if the order pattern can be linked (as shown on FIG. 1) to a specific type of machine, the analyst can identify the one process causing the yield loss.

One of the great advantages of POSITRAK is its ability to work with many different metrics associated with low yield. Yield results (taken as pure yield of separate test bins) E-test results, particle counts, in-line parametric data (e.g., polysilicon line width),.and the like may be used by POSITRAK to trace the sources of problems. Creating (and adjusting) an algorithm for each source of data would be completely undesirable. But, at the same time, the above-mentioned metrics have different ranges of variation (i.e. particles many vary form a few to hundreds, while yield variations are very much smaller). This makes it difficult to find an algorithm able to work with all sources of data.

Also, although the graphical plots shown in FIG. 1 may be studied by an analyst, and the analyst may use his knowledge and experience to identify the problem which is impacting the yield. However, this analysis by a human is time consuming. When a large number of lots must be analyzed, an automated tool is desired.

SUMMARY OF THE INVENTION

The present invention is a method and system for analyzing a process (having a plurality of processing steps) for forming a plurality of objects, wherein three different algorithms are used to identify order patterns; and one of the order patterns is selected.

A plurality of data representing characteristics of each object are extracted. A first order pattern is identified in any one of the processing steps using a decision tree, based on the data representing characteristics. A second order pattern is identified in any one of the processing steps by comparing the data representing characteristics to a predetermined threshold. A third order pattern is identified in any one of the processing steps based on a calculated distance from a centroid computed from the data representing characteristics. One of the first, second, and third order patterns is selected, and one of the processing steps is identified as being associated with the selected order pattern.

BRIEF DESCRIPTION OF THE DRAWINGS

FIG. 1 is a table showing order pattern plots generated by a software tool in the prior art.

DETAILED DESCRIPTION

Figure 2:
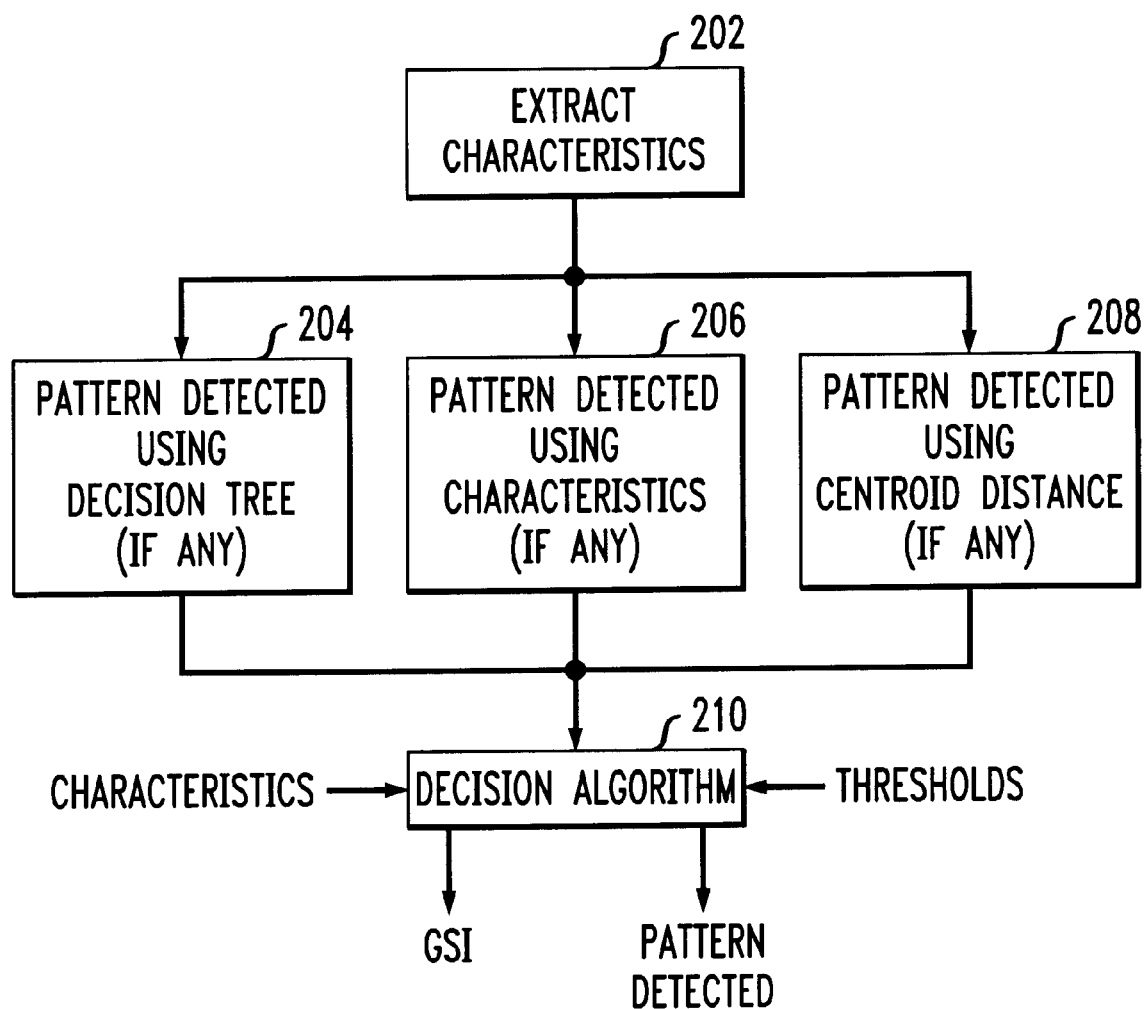
FIG. 2 is a flow chart diagram summarizing a method of analyzing yield data according to the invention.

U.S. Provisional Application No. 60/096,407, filed Aug. 13, 1998, is hereby incorporated by reference herein in its entirety.

The independent variable used in this tool is the wafer processing order at any step in the manufacturing routing. This order may be read with bar-code readers strategically located at certain steps distributed along the routing. Order data (wafer identification, position and step of reading) are stored into a database.

The processing order is preferably sampled (e.g., the wafer bar-codes are read) at strategic locations along the manufacturing routing. For example, the overall fabrication process may be divided into a set of consecutive modules (i.e. tubs, active regions, gate, drains, dielectric 1, contact 1, metal 1, . . . ). Wafer order data may be captured on each one of these modules.

A randomization of the wafers is preferably carried out at each module to efficiently use this tool. If the processing order is not varied between modules, the yield data will be confounded.

A good knowledge of the device fabrication steps as well as of the type of machines used at every step is important In particular, as explained below with reference to FIG. 3, knowledge of each machine is used to program the simulator which generates training data.

Automatic detection of order patterns is a complex process. According to the present invention, order patterns are identified based in a set of algorithms; the combination provides much better pattern detection than does a single algorithm alone.

As noted above, because different yield metrics use different scales and units, it is difficult to formulate a single algorithm for processing. The inventors' solution is to describe order patterns, not in terms of their raw data, but in terms of a set of characteristics derived form the raw data. These characteristics are common across all metrics. The adequate specification of the characteristics is the key to success with pattern detection.

Another problem associated with pattern detection is noise. Noise in data leads a reduction in the ability to detect an order pattern, even by a human expert. "Pure" order patterns are usually distorted by noise, making their recognition harder. Algorithms should be able to detect order patterns, even in the presence of noise. The solution is, again, the use of a set of characteristics to describe the order patterns.

The concept of a "pattern characteristic" is based on the ideal algorithm being robust to noise and insensitive to data range. There are as many characteristics as there are recognizable order patterns (that is, there is one characteristic designed for ⅓ patterns, another for ascending patterns and so on). Each characteristic is selected to distinguish a specific order pattern from all others. Its calculation is based on the pattern appearance, more than on particular values of the metrics. This enables detection of the order pattern, regardless of noise and/or data range.

For example, for the ascending pattern, the characteristic (s) may include the slope of the best fit regression line. The slope is positive for ascending patterns and low or negative for other patterns. Characteristics of all patterns are normalized. In the exemplary embodiment, the values of the characteristics are high (close to 1.0) when an order pattern is likely and low or negative when that order pattern is unlikely. For one pattern (recognizable or not) it is possible to obtain seven characteristics that are used by the algorithms to classify it (vector of characteristics).

At a minimum, at least one characteristic (attribute) is identified for each order pattern. There may be more Man one characteristic for any of the order patterns.

FIG. 2 is a flow chart diagram summarizing the order pattern recognition process. At step 202, characteristics are extracted from the raw data. At this stage, because the actual pattern for this particular lot is not yet identified, the characteristics associated with all of the known order patterns are extracted, and stored in a vector.

At step 204, the characteristic vector is used as an input to a decision tree, to identify a first candidate order pattern for the extracted data.

A decision tree is a well known technique, based in a set of algorithms, commonly used for classification and other tasks. Decision trees typically use binary (e.g., yes or no, true or false, and the like) decisions. Thus, decision trees are noise resistant. Training data are used to tailor a general purpose decision tree to a specific problem. The training data are based on a set of data samples. After the training period, the tree is adjusted to the specific problem, and is ready to classify.

The inventors have found that the decision tree can be trained using data generated by simulation. The simulator is a program capable of generating pattern sequences very similar to the ones encountered in real life. It is important to correctly define the training data set because the accuracy of the classification procedure depends on the training data. One of ordinary skill in the field of programming a simulator can generate simulation data which is representative of the data obtained from the machines and processes actually used.

Artificial noise may be added to training patterns to improve classification efficiency, even when noise is present. The training set is formed by a large number of patterns (preferably several hundred or more), including both recognizable patterns and unrecognizable patterns. The decision tree program is thus provided with the basis to distinguish between known patterns and unknown patterns.

At step 206, the characteristic vector is compared with a set of thresholds. Each order pattern has a threshold associated with its characteristic. If the value of the extracted characteristic is greater than or equal to the threshold for that order pattern, then that order pattern is identified as a second candidate order pattern.

As mentioned above, characteristics are associated with recognizable patterns. The characteristics are selected to distinguish one pattern class from the rest. This is the basis for the second classification algorithm. The training data set used to create the decision tree includes order patterns belonging to all the recognizable pattern classes. This set (considered to be representative of actual recognizable patterns) may be used to study the ability of every characteristic to distinguish between different pattern classes.

The input data characteristics are compared with the thresholds to determine whether there is any pattern class for which the input data characteristic is higher than its associated threshold. If this occurs, the input data is classified as showing that order pattern. (An example is described below with reference to FIG. 5.)

Figure 5:
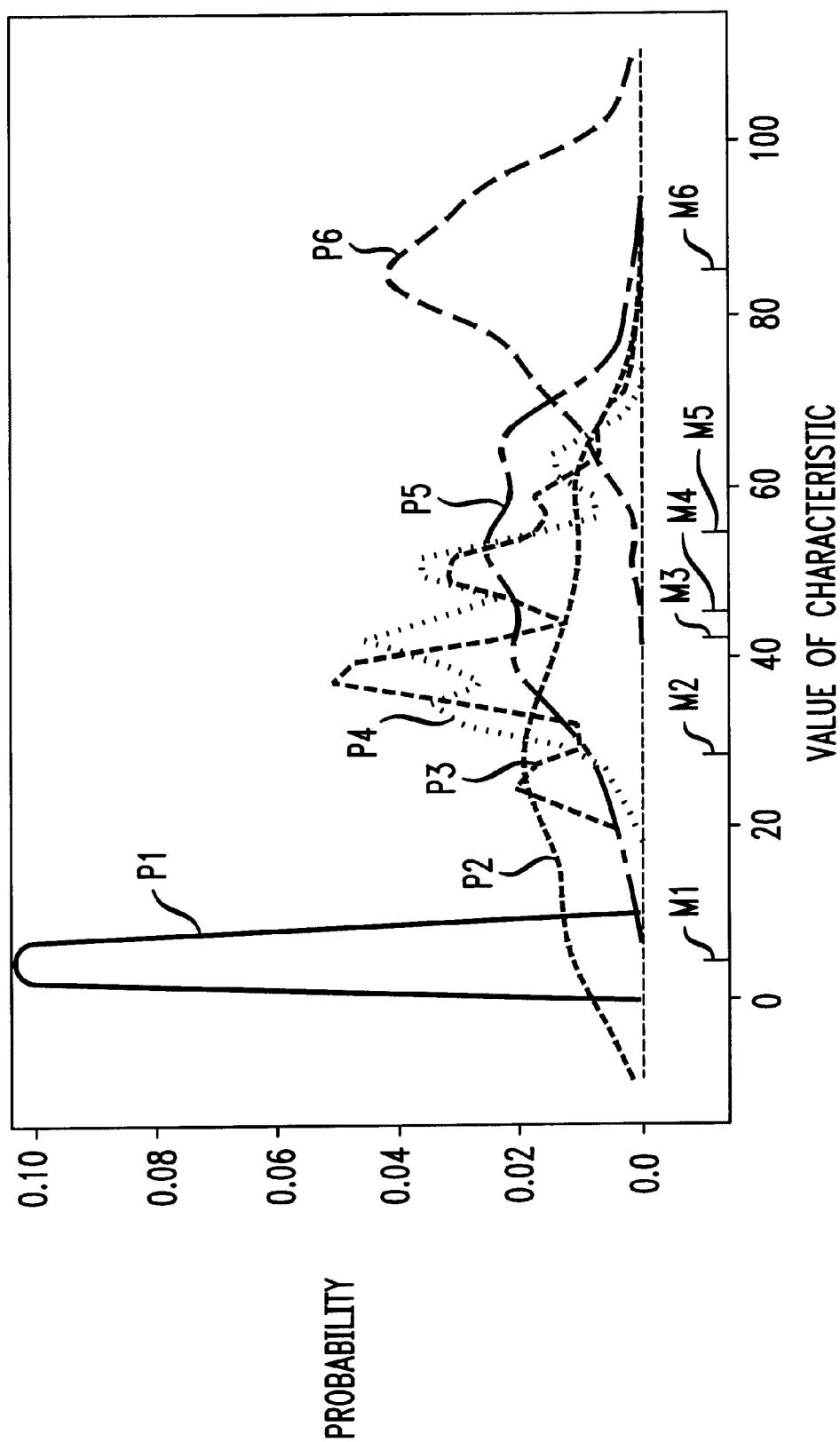
FIG. 5 is a graph showing characteristic data for several order patterns.

FIG. 5 shows a plurality of probability density functions P1 to P6 associated with six respectively different order patterns. Assume that the characteristic in this case is the slope of the yield v. processing order curve. Each of the distributions P1 to P6 shows the probability that a process exhibiting a respective order pattern assumes a given value. For example, the function P1 is associated with the ascending characteristic, P2 may be associated with a descending characteristic, etc. Curve P1 shows a 0.10 probability that the ascending characteristic has a value of about 5, and a zero probability that the ascending characteristic is greater than 20. None of the other characteristics assume a probability value greater and about 0.05. Given these data, a threshold slope value of 0.07 or 0.08 may be used for identifying an ascending order pattern. Similarly, for each other type of order pattern, a characteristic may be chosen as a discriminant for that type of order pattern.

Referring again to FIG. 2, at step 208, the input characteristic value for each order pattern is compared to a respective calculated centroid for that order pattern. Any order pattern for which the input characteristic value is within a threshold distance is identified as a third candidate order pattern.

Referring again to FIG. 5, each type of order pattern class has a known distribution P1 to P6 for any characteristic, and the distributions may be approximated by Gaussian (normal) distributions. These distributions may be represented by their respective means, M1 to M6. The means M1 to M6 are stored in a vector named the "centroid". If one set of extracted input data corresponds to one order pattern class, then for every characteristic, the input data should be within the probability distribution for that order pattern class (near the mean for that order pattern class). This idea can be quantified using the Euclidean distance. The procedure is this: given one set of extracted input data, its characteristics are grouped in a vector, and then the distance between that vector and the centroid of every order pattern is computed. If the distance to the centroid of one order pattern class is lower than a certain threshold value, the extracted input data pattern is classified as being within that class of order pattern.

Referring again to FIG. 2, at step 210, a decision algorithm selects at least one of the first second and third order patterns as being a likely order pattern. The decision algorithm outputs the detected pattern and a score indicating the degree of confidence that the identified order pattern is correct.

The algorithms presented in steps 204, 206 and 208 are the basis for the final decision process at step 210. Although FIG. 2 shows steps 204, 206, and 208 being performed in parallel, they may be performed in parallel or in any sequence, because the three steps are independent from each other.

The decision procedure 210 receives, as inputs, the results obtained from the decision tree (step 204), the threshold algorithm (step 206) and the Euclidean distance (step 208), the value for the characteristics of the pattern to be classified, and the thresholds.

An algorithm suitable for this purpose may be, for example, a weighted function of the results given by the three classification criteria. The output of the algorithm is an order pattern class (if a recognizable pattern is found) and a number (GSI) between 0 and 100% representing how similar the input pattern is to the known patterns in the training data set. The weights are designed to maximize detection capabilities, based in the results obtained with actual data.

A system according to the invention may be embodied in a computer program executed on a general purpose processor, which may be configured with a memory, non-volatile storage device (e.g., a hard disk), display, keyboard, and pointing device.

Figure 3:
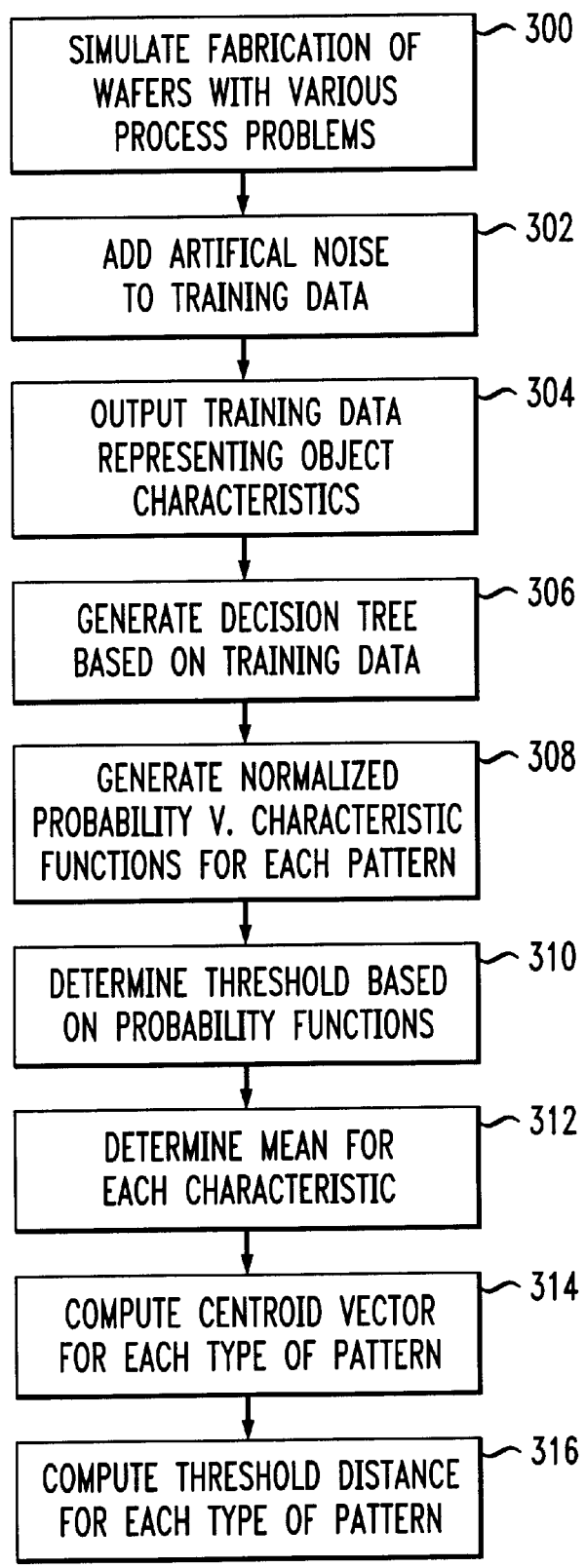
FIG. 3 is a flow chart diagram showing the data initialization and training procedure for setting up a software program according to the invention.

FIG. 3 is a flow chart diagram of an exemplary method for setting up a system according to the invention.

At step 300, a program is run to simulate fabrication of a set of objects (which may for example be one or more lots of semiconductor wafers) by a set of process steps. During the simulation, at least one of the set of process steps has a defect. Preferably, during many simulated iterations of the process, all of the process steps are simulated having process defects or problems in some of the simulated iterations. It is also preferable that the simulation include process step defects for the process steps in a variety of combinations with each other, to better train the system to recognize such combinations of problems.

At step 302, artificial noise may be added to the training data to better train the system to detect order patterns within noisy data.

At step 304 training data representing object characteristics are output.

At step 306, the turning data are provided to a system for generating a decision tree. A conventional decision tree generating program may be used, for example, a decision tree generator as described in S. K. Murthy, S. Kasif, S. Salzberg "A System for Induction of Oblique Decision Trees," Journal of Artificial Intelligence Research 2 (1994) 1–32, which is incorporated herein by reference, in its entirety. Other conventional decision tree generators may also be used.

At step 308, the training data are used to compute a plurality of probability distribution functions for each characteristic. Each of the plurality of probability distribution functions identifies a probability that a particular type of order pattern is present as a function of the value of the characteristic.

At step 310, a threshold is determined for each type of order pattern, based on the plurality of probability distribution functions. Because the simulated defects or problems used to generate the training data are known, the type of order pattern expected for these types of defects are also known from empirical data. The thresholds can be selected so that any simulated characteristic data generated for a given order pattern lie above the threshold for that characteristic. These thresholds are used during step 206 (FIG. 2).

At step 312, the mean value of each characteristic is determined, for each of the order patterns, based on the training data.

At step 314, a respective centroid vector is computed for each type of order pattern, using the mean values from step 312. Each centroid vector includes a plurality of mean values, i.e., a respective mean value for each characteristic.

At step 316, a threshold distance is computed for each type of order pattern. The threshold distances may be selected so that any simulated characteristic data generated for a given order pattern lie within the distance threshold for that characteristic.

Although the diagram shows step 306 preceding step 308, step 306 is performed independently of steps 308–316. Thus, step 306 may also be performed in parallel to steps 308–316, or after step 316.

Having completed these training and configuration steps, the system is ready to analyze a set of input data. Although the example presents all of these preparation steps as preceding any of the analysis steps, the preparation steps may be interleaved with the analysis steps, as long as any output of the setup is available when required for performance of a specific analysis step. For example, the generation of the decision tree could be performed any time before the step of applying the decision tree.

The inventors have constructed an exemplary program in accordance with the invention, named, "POSISCAN." POSISCAN is organized in three parts. Two of them allow the user to work in a interactive way and visualize graphics and numeric outputs. The third part performs the same functionality in an automatic way.

POSISCAN is structured in three blocks: a data generator, a viewer for the order patterns (as described above) and an automatic mode of operation.

The user selects the data set he is going to analyze. The lot, or group of lots, is chosen by one of the following methods:

(1) Providing specific inputs to the program, such as date range, Technologies, codes, process machine, process zone, or the like. The tool can automatically generate the group of lots.
(2) Providing a file containing a list of lots.
(3) Providing inputs by writing directly to a file used by the application, while running the application.

Once the group of lots to be analyzed is determined, a metric is provided to the program. The metric is the parameter used to distinguish whether a wafer is to be considered as good or bad. The choice of metric depends on the particular problem being analyzed and it is very important to choose a metric that best describes the problem. So, depending on the type of problem, exemplary metrics may include: the number of particles detected in an inspection tool, an E-test parameter or, a wafer probe parameter (yield parameter) such as one bin category, DO or Yield. A menu may offers all these metrics as possible choices in the screen.

The different metrics may be grouped into three different areas: In-Line (process parameter, particles and defects at every step of the line), E-test and Wafer Probe (Yield, Probe Bins, Bitmap signatures, or the like). Once the group of lots and the metric have been selected from the database, the set of data is ready to run the program.

Once the metrics are input, the user can review the output, and analyze the information the tool provides. This not only provides an inter-face to visualize the output, but also offers the possibility of training the program with order patterns previously defined by the user. At least for an initial period of time, it is necessary to provide (to the tool) suitable information for the program to learn how to distinguish between different pattern classes. This also provides to POSISCAN the possibility to recognize a pattern class with exceptions (that is, samples that do not obey the general rule for their pattern class), which frequently occur in practice.

Figure 4:
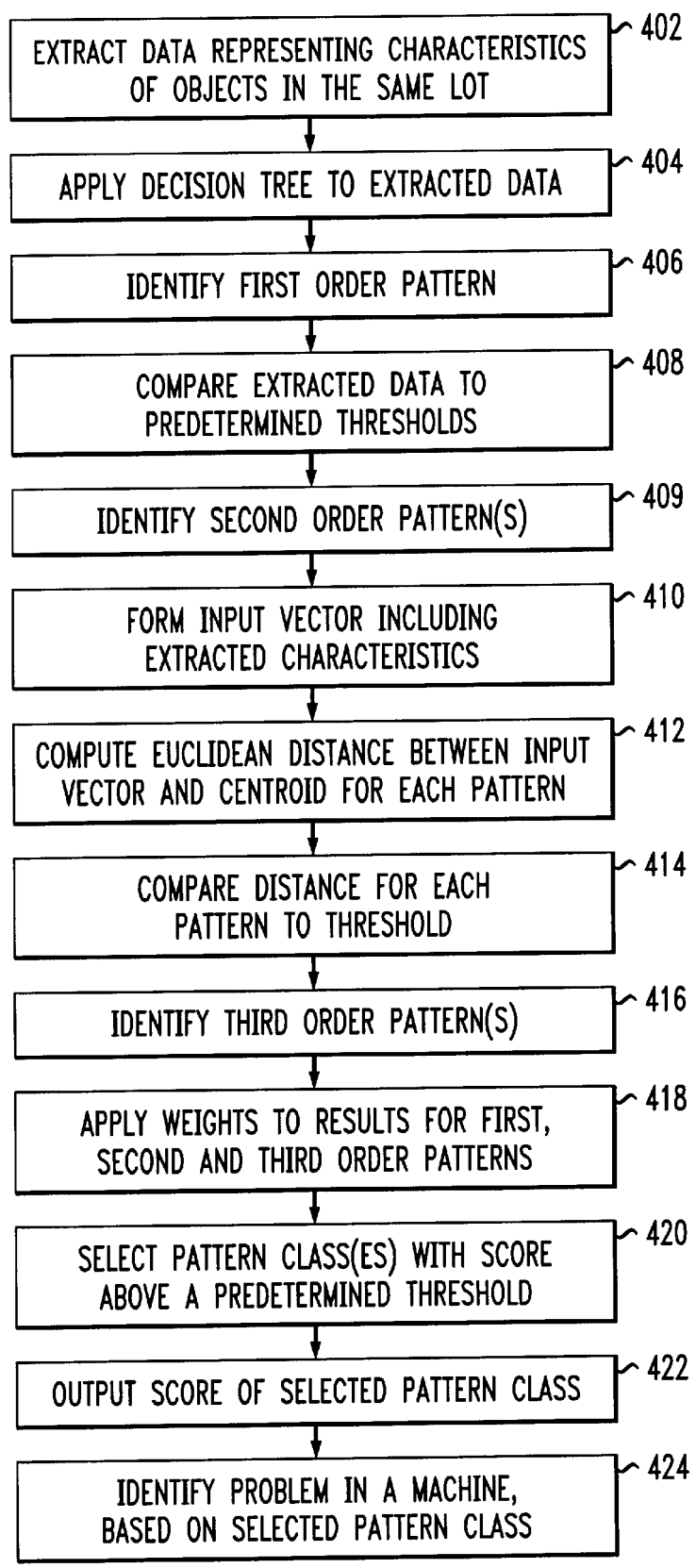
FIG. 4 is a flow chart diagram showing, in greater detail, the method of FIG. 2.

FIG. 4 is a flow chart diagram showing the details of an exemplary method for analyzing a process for fabricating a plurality of semiconductor wafers. The process has a plurality of processing steps. Each of the processing steps includes a step of using one of a plurality of machines. At least two of the processing steps use respectively different machines.

At step 402, a plurality of data representing characteristics of each wafer in the lot are extracted. The characteristics are the same characteristics described above with reference to FIG. 3.

At step 404, the decision tree is applied to the input characteristic data. The decision tree may be generated any time prior to this step.

At step 406, a first order pattern is identified in any one or more of the processing steps using the decision tree, based on the data representing characteristics.

At step 408, the extracted characteristic data are compared to the predetermined thresholds.

At step 409, any order pattern class for which the input characteristic exceeds the threshold value (determined at step 310) is identified as a second candidate order pattern.

At step 410, an input vector is formed, including the extracted characteristic values.

At step 412, the Euclidean distance between the input vector and the centroid vector (determined at step 314) is determined for each pattern.

At step 414, the Euclidean distance for each pattern is compared to the threshold.

At step 416, a third order pattern is identified, in any one of the processing steps based on a calculated distance from a centroid computed from the data representing characteristics.

At step 418, a weight function is applied to the first, second and third candidate order patterns.

At step 420, any order pattern for which the probability of a correct order pattern detection is above a user defined predetermined threshold is selected. Alternatively, the most likely one of the first, second, and third order patterns is selected, and one of the processing steps is identified as being associated with the selected order pattern.

At step 422, the name and score of the selected order pattern are output.

At step 424, a problem may be automatically identified in one of the plurality of machines, based on a type of problem associated with the selected order pattern. If, within the module for which the order pattern is detected, there is only one machine of a type which is known to be related to the detected type of order pattern, then that machine can be automatically identified. If there is more than one such machine, then all of the machines (within the pertinent module) which are of the type associated with the detected pattern class can be identified.

An advantageous feature of this tool is the possibility of automatically generating different types of reports with information about the order patterns found. Once the yield metric has been chosen, for every tested lo; the program is automatically executed and the information is then loaded into a database that is used to generate a variety of reports.

Available information, for every lot, includes:
(1) The patterns found in every step of the fabrication line.
(2) The degree of confidence for every one of the patterns found in every lot.
(3) The GSI for every one of the patterns found.

This type of information is generated as soon as every lot is tested. POSISCAN scans every lot and every step (module) detecting order patterns wherever they are detected within the degree of confidence fixed. These data is very relevant for the yield analyst because it points his/her attention to an specific module (or set of steps) within the whole routing. Speed and chances of success in the analysis/corrective action flow, are dramatically increased.

Table 1 shows a typical output of POSISCAN for three specific lots. The first column is the identification number of the lot(s). The second column is the module where relevant order patterns have been identified. The third column is the type of pattern found. Column four shows the confidence values for each order pattern. The output only displays those order pattern with a confidence over user defined threshold value.

TABLE 1

| LOT | MODULE (STEP) | ORDER PATTERN | DEGREE OF CONFIDENCE |
|---|---|---|---|
| 36555–55000 | POLY-GATE | 1/2 | 96% |
|  |  | DESCENDING | 78% |
| 36555–5555 | CONTACT 1 | ASCENDING | 86% |
|  |  | 1/3 | 70% |
| 37777–55555 | METAL 2 | ASCENDING | 98% |
|  |  | 1/2 | 72% |

Figure 6:
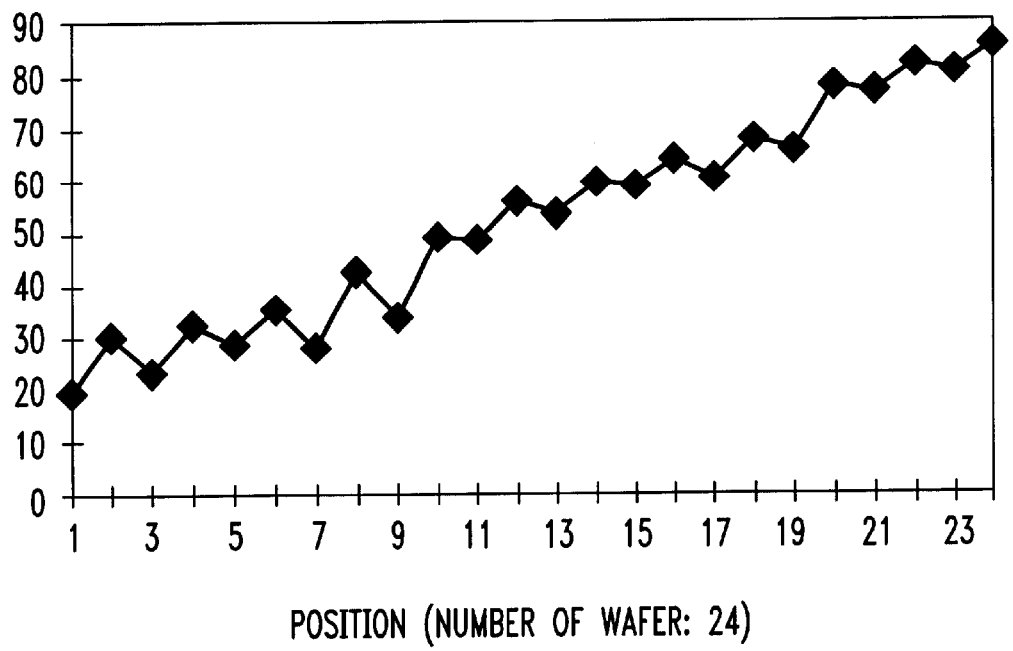
FIG. 6 is a graph showing both the ascending and ½ order patterns.
Figure 7:
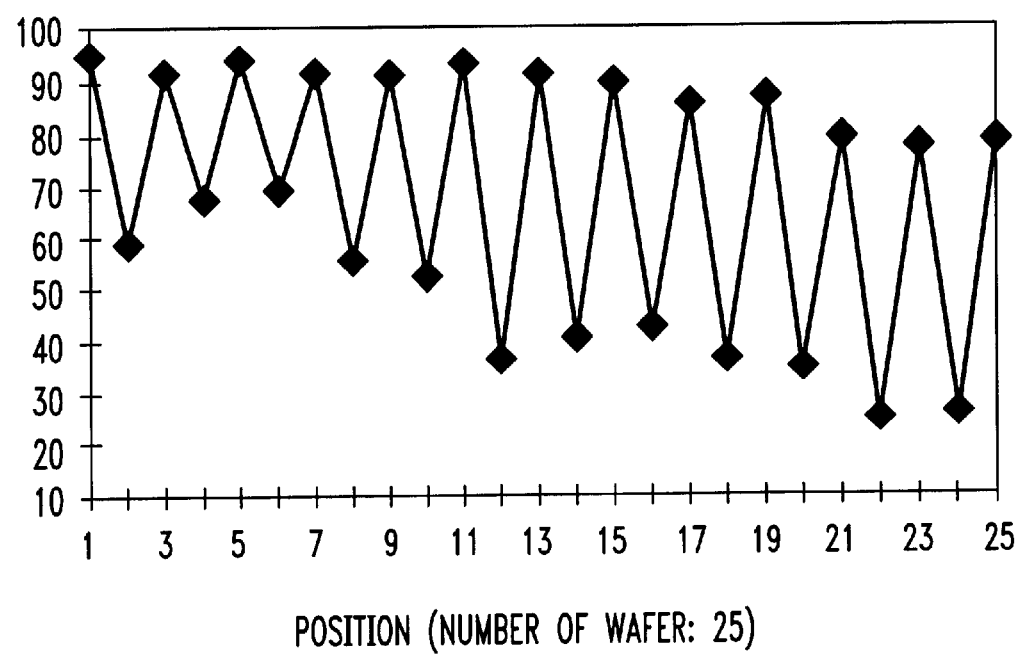
FIG. 7 is a graph showing both the ½ and descending order patterns.

FIGS. 6 and 7 are graphs showing two of the patterns listed in Table 1. FIG. 6 shows the ascending pattern for the lot 37777-55555 in the METAL 2 module. The best fit regression line (not shown) has a positive slope. Although the graph in FIG. 6 alternates regularly between local minima and local maxima, the local minima and local maxima are do not differ greatly from the nearest value on either side. This is consistent with the data in Table 1, which list the ascending order pattern as being most likely, and the ½ order pattern as the next most likely order pattern.

FIG. 7 shows a ½ pattern for the lot 36555-55000 in the POLY-GATE module.

Although the best fit regression line for this lot has a negative slope, the slope is very small, and there is a large difference between the local minima and local maxima in FIG. 7. This is consistent with the data in Table 1, which indicate that the most likely order pattern is ½, and the second most likely is descending.

Other type of reports are available for the user to make a deeper analysis. For example, the reports may include: "Patterns Histogram", "Report by lot with confidence and GSI range", and/or "Report for a selection of lots" (showing the different patterns found for every lot with the confident degree and GSI). Another optional report, "last week lots" can provide warnings, if any type of pattern is consistently repeated during a period of time. Alternatively, this report may look at the set of lots tested during the last seven days and investigate the problem related to patterns found in this report automatically.

Although the exemplary embodiment is an application of the invention to fabrication of semiconductor wafers, the invention may be applied to analyze data collected during other fabrication processes that involve multiple steps, using multiple materials or machines.

Although the exemplary embodiment uses three different algorithms to independently generate a set of candidate order patterns, other algorithms besides the three described herein may be used. The number of algorithms may also be varied; the accuracy of the results is expected to improve as the number of algorithms used to generate the candidate order patterns is increased. Thus, the inventors contemplate that the invention may be practiced by using a plurality of algorithms to independently generate candidate order patterns, and selecting at least one of the candidates.

The present invention may be embodied in the form of computer-implemented processes and apparatus for practicing those processes. The present invention may also be embodied in the form of computer program code embodied in tangible media, such as floppy diskettes, read only memories (ROMs), CD-ROMs, hard drives, or any other computer-readable storage medium, wherein, when the computer program code is loaded into and executed by a computer, the computer becomes an apparatus for practicing the invention. The present invention may also be embodied in the form of computer program code, for example, whether stored in a storage medium, loaded into and/or executed by a computer, or transmitted over some transmission medium, such as over the electrical wiring or cabling, through fiber optics, or via electromagnetic radiation, wherein, when the computer program code is loaded into and executed by a computer, the computer becomes an apparatus for practicing the invention. When implemented on a general-purpose processor, the computer program code segments configure the processor to create specific logic circuits.

The examples described above merely illustrate the principles of the invention. It will thus be appreciated that those skilled in the art will be able to devise various arrangement which, although not explicitly described or shown herein, embody the principles of the invention and are included within its spirit and scope. Furthermore, all examples and conditional language recited herein are principally intended expressly to be only for pedagogical purposes to aid the reader in understanding the principles of the invention and the concepts contributed by the inventor(s) to furthering the art, and are to be construed as being without limitation to such specifically recited examples and conditions. Moreover, all statements herein reciting principles, aspects, and embodiments of the invention, as well as specific examples thereof, are intended to encompass both structural and functional equivalents thereof. Additionally, it is intended that such equivalents include both currently known equivalents as well as equivalents developed in the future, regardless of structure.

Thus, for example, it will be appreciated by those skilled in the art that the flow charts, herein represent various processes which may be substantially represented in computer readable medium and so executed by a computer or processor, whether or not such computer or processor is explicitly shown.

The functions of the various elements shown in the drawings may be provided through the use of dedicated hardware as well as hardware capable of executing software in association with appropriate software. When provided by a processor, the functions may be provided by a single dedicated processor, by a single shared processor, or by a plurality of individual processors, some of which may be shared. Moreover, explicit use of the term "processor" or "controller" should not be construed to refer exclusively to hardware capable of executing software, and may implicitly include, without limitation, digital signal processor (DSP) hardware, read-only memory (ROM) for storing software, random access memory (RAM), and non-volatile storage. Other hardware, conventional and/or custom, may also be included.

In the claims below, any element expressed as a means for performing a specified function is also intended to also encompass: (a) a combination of circuit elements which performs that function or (b) computer program code in any form, including firmware, microcode or the like, combined with appropriate circuitry for executing that software to perform the function. Applicant thus regards any of these means which can provide those functionalities as equivalent as those shown herein.

What is claimed is:

1. A method for analyzing a process for forming a plurality of objects, the process having a plurality of processing steps, the method comprising the steps of:
   (a) extracting a plurality of data representing characteristics of each object;
   (b) identify a first order pattern in any one of the processing steps using a decision tree, based on the data representing characteristics;
   (c) identifying a second order pattern in any one of the processing steps by comparing the data representing characteristics to a predetermined threshold;
   (d) identifying a third order pattern in any one of the processing steps based on a calculated distance from a centroid computed from the data representing characteristics;
   (e) selecting one of the first, second, and third order patterns, and identifying one of the processing steps as being associated with the selected order pattern.

2. The method according to claim 1, wherein each of the objects is a semiconductor wafer, and the process is a process for fabricating the semiconductor wafers.

3. The method according to claim 1, wherein:
   each of the processing steps includes a step of using one of a plurality of machines, and
   at least two of the processing steps use respectively different ones of the plurality of machines.

4. The method according to claim 3, further comprising the step of identifying a problem in one of the plurality of machines, based on a type of problem associated with the selected order pattern.

5. The method according to claim 1, wherein step (b) includes the steps of:
   (b1) simulating fabrication of a set of objects by a set of process steps, wherein at least one of the set of process steps has a defect, and providing training data representing object characteristics as an output of the simulating step;
   (b2) using the training data to form the decision tree.

6. The method according to claim 5, wherein step (b1) includes adding artificial noise to the training data.

7. The method according to claim 1, wherein step (c) includes:
   computing a plurality of probability distribution functions for each characteristic, each of the plurality of probability distribution functions identifying a probability that a particular type of order pattern is present as a function of the value of the characteristic; and
   determining the predetermined threshold based on the plurality of probability distribution functions.

8. The method according to claim 1, wherein step (d) includes:
   computing a respective centroid vector for each type of order pattern;
   forming an input vector which includes the value of each characteristic extracted in step (a);
   computing a respective distance between the input vector and each centroid vector; and
   identifying, as the third order pattern, any order pattern for which the distance is less than a respective predetermined threshold for that order pattern.

9. The method according to claim 8, wherein each centroid vector includes a respective mean value for each characteristic.

10. A computer implemented system for analyzing a process for forming a plurality of objects, the process having a plurality of processing steps, the system comprising:
    means for extracting a plurality of data representing characteristics of each object;
    means for identifying a first order pattern in any one of the processing steps using a decision tree, based on the data representing characteristics;
    means for identifying a second order pattern in any one of the processing steps by comparing the data representing characteristics to a predetermined threshold;
    means for identifying a third order pattern in any one of the processing steps based on a calculated distance from a centroid computed from the data representing characteristics;
    means for selecting one of the first, second, and third order patterns, and identifying one of the processing steps as being associated with the selected order pattern.

11. The system according to claim 10, wherein the first order pattern identifying means include:
    (b1) means for simulating fabrication of a set of objects by a set of process steps, wherein at least one of the set of process steps has a defect, and for providing training data representing object characteristics as an output;
    (b2) means for forming the decision tree based on the training data.

12. The system according to claim 11, wherein the simulating means include means for adding artificial noise to the training data.

13. The system according to claim 10, wherein the second order pattern identifying means include:
    means for computing a plurality of probability distribution functions for each characteristic, each of the plurality of probability distribution functions identifying a probability that a particular type of order pattern is present as a function of the value of the characteristic; and
    means for determining the predetermined threshold based on the plurality of probability distribution functions.

14. The system according to claim 10, wherein the third order pattern identifying means include:
    means for computing a respective centroid vector for each type of order pattern;
    means for forming an input vector which includes the value of each characteristic extracted by the extracting means;
    means for computing a respective distance between the input vector and each centroid vector; and
    means for identifying, as the third order pattern, any order pattern for which the distance is less than a respective predetermined threshold for that order pattern.

15. The system according to claim 14, wherein each centroid vector includes a respective mean value for each characteristic.

16. A storage medium encoded with machine-readable computer program code for causing a processor to analyze a process for forming a plurality of objects, the process having a plurality of processing steps, the system comprising:
    means for causing the processor to extract a plurality of data representing characteristics of each object;
    means for causing the processor to identify a first order pattern in any one of the processing steps using a decision tree, based on the data representing characteristics;

means for causing the processor to identify a second order pattern in any one of the processing steps by comparing the data representing characteristics to a predetermined threshold;

means for causing the processor to identify a third order pattern in any one of the processing steps based on a calculated distance from a centroid computed from the data representing characteristics;

means for causing the processor to select one of the first, second, and third order patterns, and to identify one of the processing steps as being associated with the selected order pattern.

17. The storage medium according to claim 16, wherein the first order pattern identifying means include:

(b1) means for causing the processor to simulate fabrication of a set of objects by a set of process steps, wherein at least one of the set of process steps has a defect, and for providing training data representing object characteristics as an output;

(b2) means for causing the processor to form the decision tree based on the training data.

18. The storage medium according to claim 17, wherein the simulating means include means for causing the processor to add artificial noise to the training data.

19. The storage medium according to claim 17, wherein the second order pattern identifying means include:

means for causing the processor to compute a plurality of probability distribution functions for each characteristic, each of the plurality of probability distribution functions identifying a probability that a particular type of order pattern is present as a function of the value of the characteristic; and means for causing the processor to determine the predetermined threshold based on the plurality of probability distribution functions.

20. The storage medium according to claim 17, wherein the third order pattern identifying means include:

means for causing the processor to compute a respective centroid vector for each type of order pattern;

means for causing the processor to form an input vector which includes the value of each characteristic extracted by the extracting means;

means for causing the processor to compute a respective distance between the input vector and each centroid vector; and means for causing the processor to identify, as the third order pattern, any order pattern for which the distance is less than a respective predetermined threshold for that order pattern.

21. The storage medium according to claim 17, wherein each centroid vector includes a respective mean value for each characteristic.

22. A method for analyzing a process for forming a plurality of objects, the process having a plurality of processing steps, the method comprising the steps of:

(a) extracting a plurality of data representing characteristics of each object;

(b) identifying a first order pattern in any one of the processing steps based on the extracted data, using a first order pattern detection algorithm;

(c) identifying a second order pattern in any one of the processing steps based on the extracted data using a second order pattern section algorithm different from the first order pattern detection algorithm;

(d) selecting one of the first and second order patterns, and identifying one of the processing steps as being associated with the selected order pattern.

* * * * *